(12) United States Patent
Sarkar et al.

(10) Patent No.: US 11,538,988 B2
(45) Date of Patent: Dec. 27, 2022

(54) MEMORY DEVICE WITH MULTI-LAYER LINER STRUCTURE

(71) Applicant: INTEL CORPORATION, Santa Clara, CA (US)

(72) Inventors: Santanu Sarkar, Boise, ID (US); Andrea Gotti, Boise, ID (US); Adam William Saxler, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 780 days.

(21) Appl. No.: 16/295,671

(22) Filed: Mar. 7, 2019

(65) Prior Publication Data

US 2020/0287129 A1 Sep. 10, 2020

(51) Int. Cl.
*H01L 45/00* (2006.01)
*H01L 25/03* (2006.01)
*H01L 27/24* (2006.01)

(52) U.S. Cl.
CPC .............. *H01L 45/06* (2013.01); *H01L 25/03* (2013.01); *H01L 27/2463* (2013.01); *H01L 45/1233* (2013.01); *H01L 45/141* (2013.01)

(58) Field of Classification Search
CPC ...................................................... H01L 45/06
See application file for complete search history.

(56) References Cited

U.S. PATENT DOCUMENTS

| | | | | |
|---|---|---|---|---|
| 10,147,875 | B1 * | 12/2018 | Hansen | ............... H01L 27/1026 |
| 11,183,627 | B2 * | 11/2021 | Chen | ..................... H01L 27/228 |
| 2019/0036022 | A1 | 1/2019 | Pirovano et al. | |
| 2019/0088873 | A1 * | 3/2019 | Fantini | .................. H01L 45/144 |

OTHER PUBLICATIONS

Karpov, et. al., "Phase Change Memory with Chalcogenide Selector (PCMS): Characteristic Behaviors, Physical Models and Key Material Properties," Mater. Res. Soc. Symp. Proc. vol. 1250, 2010 Materials Research Society, 10 pages.

* cited by examiner

*Primary Examiner* — Mounir S Amer
(74) *Attorney, Agent, or Firm* — Compass IP Law PC

(57) ABSTRACT

A memory cell design is disclosed. The memory cell structure includes phase change and selector layers stacked between top and bottom electrodes. An ohmic contact may be included between the phase change and selector layers. A multi-layer liner structure is provided on sidewalls of the phase change layer. In some such cases, the liner structure is above and not on sidewalls of the selector layer. The liner structure includes a first dielectric layer, and a second dielectric layer on the first dielectric layer. The liner structure includes a third dielectric layer on the second dielectric layer and that is sacrificial in nature, and may not be present in the final structure. The second dielectric layer comprises a high-k dielectric material or a metal silicate material. The second dielectric layer protects the phase change layer from lateral erosion and physical vertical etch and provides etch selectivity during the fabrication process.

19 Claims, 11 Drawing Sheets

MEMORY DEVICE WITH MULTI-LAYER LINER STRUCTURE

BACKGROUND

As electronic devices continue to become smaller and more complex, the need to store more data and access that data quickly similarly grows. New memory architectures have been developed that use an array of memory cells with so-called phase change materials (PCM) that have variable bulk resistance, allowing the resistance value to dictate whether a given memory cell stores a logic '0' or a logic '1'. Many challenges exist when fabricating such PCM-based memory architectures.

BRIEF DESCRIPTION OF THE DRAWINGS

Features and advantages of embodiments of the claimed subject matter will become apparent as the following Detailed Description proceeds, and upon reference to the Drawings, in which:

Figure 1A:
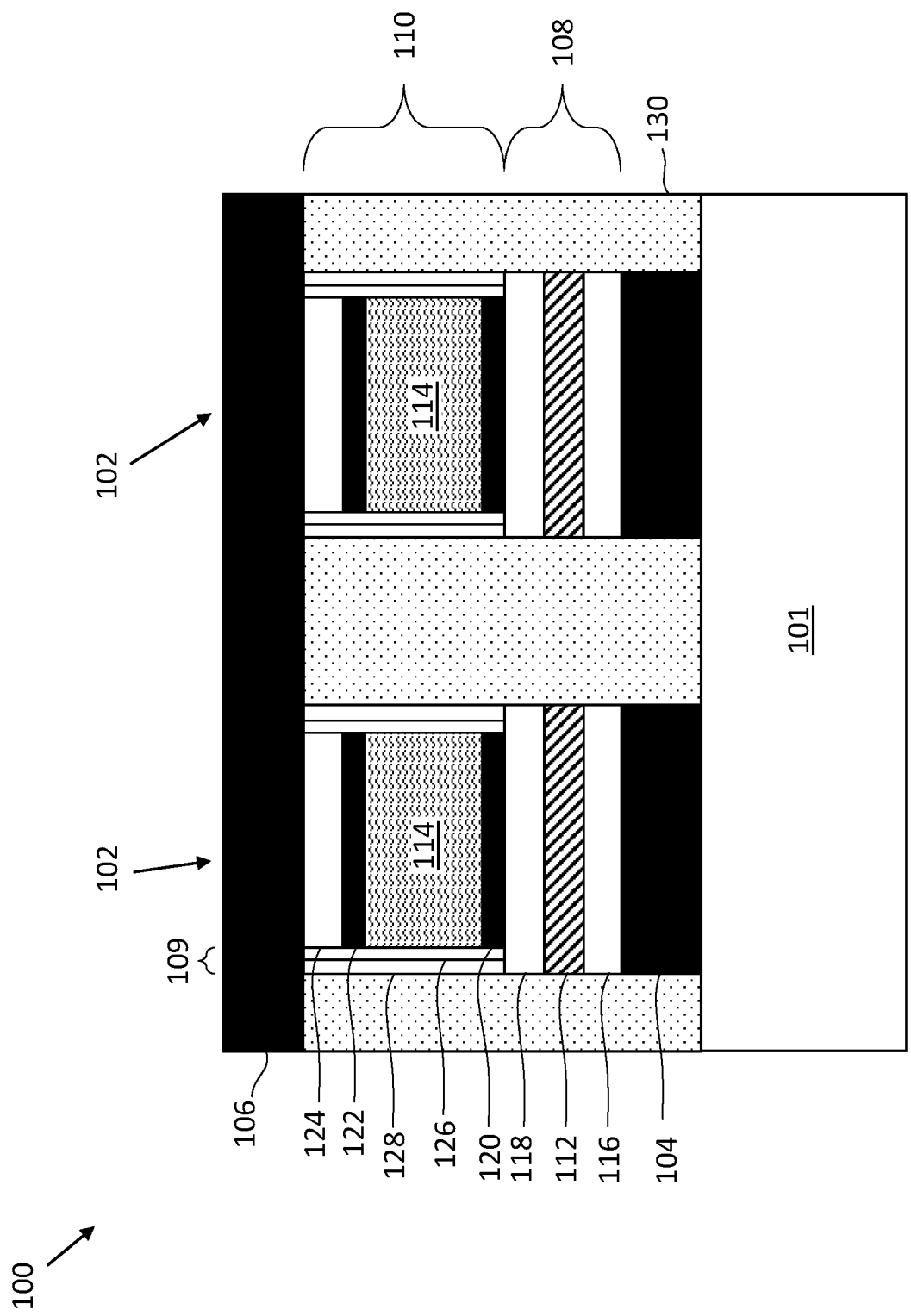
FIG. 1A illustrates a cross-section view of a portion of a stacked array of memory cells, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

A memory cell design is disclosed. The design is particularly well-suited for three-dimensional cross-point (3D X-point) memory configurations, although other memory applications that can benefit as will be apparent. In an embodiment, the memory cell structure includes phase change and selector layers stacked between top and bottom electrodes. The phase change layer provides a storage element, and the selector layer provides a selector element that allows access to the storage element. An ohmic contact may be included between the phase change and selector layers. In any case, a multi-layer liner structure is provided on sidewalls of the phase change layer. In some such cases, the liner structure is above and not on sidewalls of the selector layer. The liner structure includes a first dielectric layer, and a second dielectric layer on the first dielectric layer. In some cases, the liner structure may include a third dielectric layer on the second dielectric layer and that is sacrificial in nature, and may therefore not be present in the final structure. The second dielectric layer comprises a high-k dielectric material or a metal silicate material. As will be appreciated in light of this disclosure, the second dielectric layer effectively protects the phase change layer from lateral erosion and physical vertical etch and provides etch selectivity during the fabrication process. Numerous configurations and embodiments will be apparent.

General Overview

As noted above, there are several non-trivial issues associated with fabricating memory arrays based on bulk resistance changes of a phase change material. For example, in some cases, the phase change material is included as a layer in a multi-layer stack that further includes a switching material layer as well as electrode material layers. This multi-layer stack is then etched into an array of smaller individual stacks. Each individual stack can be used as one memory cell in the overall array. One issue that arises during this etch process is that the stack is relatively tall, and thus the top layers are subjected to the etch process for a relatively long time in order for the etch to reach the bottom of the stack, which tends to damage or degrade those upper material layers. Another issue is that the etch process exposes various material layers as it continues through the stack, and some materials can contaminate other materials if they are exposed together in the same etching chamber. One possible solution is to break the etch process into first and last partial etches, where the first partial etch is used to expose sidewalls of the phase change material of the stack, and the final partial etch is then used after a liner structure is provided to protect the now exposed phase change material. However, and as will be further appreciated in light of this disclosure, the particulars of such a liner structure are not trivial. For instance, on one hand, the liner structure must be very thin, lest the trench resulting from the first partial etch will pinch-off during liner deposition and therefore block the final partial etch. This pinch-off based constraint is particularly troublesome as the aspect ratio of the stack trenches increases with increased scaling. On the other hand, if the liner structure is not thick enough, then it will fail to sufficiently protect the phase change material during the final partial etch process. Thus, an adequate liner structure that can both protect the underlying material layers and not impede subsequent processing would be beneficial.

Techniques and memory cell designs are provided herein to help eliminate or otherwise reduce such issues. In an example embodiment, a fabrication methodology is provided that uses a tri-layer liner structure that incorporates a high-k dielectric film, or a metal silicate film, having excellent etch selectivity. The method includes depositing a stack of layers over a substrate where the layer stack comprises at least one conductive layer and at least one selector layer followed by depositing a phase change layer. In some cases, one or more intervening conductive layers may be deposited between the switching and phase change layers, to provide better ohmic contact between the switching material and phase change material. In such cases, note that the intervening conductive layers may be within or otherwise part of a switching structure and/or phase change structure. The method further includes depositing one or more conductive layers over the phase change layer. A first partial etch is performed that includes etching through an upper thickness of the stack that includes the phase change layer, thereby exposing sidewalls of the phase change layer. After this first partial etching, the method includes depositing the tri-layer liner structure. In one such embodiment, this includes depositing a first dielectric layer over the stack of layers at least including the exposed sidewalls of the phase change layer, depositing a second dielectric layer over the first dielectric layer, and depositing a third dielectric layer over the second dielectric layer. Although the materials may vary as will be appreciated, in one such embodiment the first dielectric layer comprises a nitride (e.g., silicon nitride) that provides adhesion and protects the stack from subsequent depositions, the second dielectric layer comprises a conformal gate dielectric (e.g., hafnium oxide) that provides etch selectivity, and the third dielectric layer comprises an oxide (e.g., silicon oxide) that protects the stack from the final partial etch. With the liner structure in place, the method continues with the final partial etch, which includes etching through a planar thickness of the first, second, and third dielectric layers in the horizontal field portions, and through the remaining portion of the stack of layers (so as to liberate the bottom electrodes). Note that the third dielectric layer is sacrificial in nature, and may be at least partially removed during the final partial etch.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 1" may be used to refer to the collection of drawings of FIGS. 1A-1B, and the phrase "FIG. 3" may be used to refer to the collection of drawings of FIGS. 3A-E.

It should be readily understood that the meaning of "above" and "over" in the present disclosure should be interpreted in the broadest manner such that "above" and "over" not only mean "directly on" something but also include the meaning of over something with an intermediate feature or a layer therebetween. Additionally, the meaning of "on" in the present disclosure should be interpreted to mean directly on something (i.e., having no intermediate feature or layer therebetween.)

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. A substrate can be a layer, can include one or more layers therein, and/or can have one or more layer thereupon, thereabove, and/or therebelow.

Memory Array Architecture

FIG. 1A illustrates a cross-section view of a portion 100 of a memory cell array, according to an embodiment. Portion 100 includes adjacent memory cells 102 each including a stack of material layers sandwiched between a particular word line 104 and bit line 106, according to some embodiments. A potential is applied across a particular word line 104 and a particular bit line 106 in order to read from or program the memory cell 102 at the intersection of (between) the chosen word line 104 and chosen bit line 106. In this manner, word lines 104 and bit lines 106 provide top and bottom electrodes to memory cells 102. As noted in this example, word lines 104 run orthogonal to bit lines 106. Word lines 104 and bit lines 106 may be made of any conductive material, such as a metal, metal alloy, or polysilicon. In some examples, word lines 104 and bit lines 106 are made of tungsten, silver, aluminum, gold, carbon, or copper, or a multi-layer structure comprising such materials (e.g., tungsten and carbon layers).

Each memory cell 102 includes a first stack of layers 108 having at least one selector layer 112 and a second stack of layers 110 having at least one phase change layer 114, according to an embodiment. Selector layer 112 includes a material that acts similarly to a diode and is highly resistive until a threshold potential is applied across it, at which point its resistance lowers and current passes through it, according to some embodiments. Examples of materials for selector layer 112 include chalcogenide-based alloys, such as germanium telluride or germanium antimony telluride doped with arsenic. Any number of chalcogenides can be used to provide a standard selector layer 112.

As used herein, the term "selector layer" refers to the standard meaning of that phrase in the context of memory devices, and in some cases refers to one or more layers that includes a material capable of acting as a selector. For example, at least one selector layer 112 may include a chalcogenide alloy, such as chalcogenide doped with arsenic. As will be appreciated, such chalcogenide-based materials can be used as a selector for the memory cells of the array. The selector effectively provides access to the bit (logic '0' or '1') stored by the phase change layer 114.

Phase change layer 114 includes a material that changes its phase to either represent a logic '0' or a logic '1' for the given memory cell 102. As used herein, the term "phase change layer" refers to the standard meaning of that phrase in the context of memory devices, and in some cases refers to one or more layers that includes a metalloid alloy. The metalloids include boron (B), silicon (Si), germanium (Ge), arsenic (As), antimony (Sb), tellurium (Te), and polonium (Po). In some embodiments, phase change layer 114 includes chalcogenide, which comprises an alloy of germanium, arsenic, antimony, and tellurium, such as GeTe, GeSbTe, GeBiTe (GeTe alloyed with bismuth), or GeInSbTe (GeSbTe alloyed with indium), to name a few non-limiting examples. Moreover, note the stoichiometry of such compounds may vary from one embodiment to the next, and such compounds represented without stoichiometric coefficients or values are intended to represent all forms of that compound.

In one example, chalcogenide is used as the phase change material and can change between an amorphous state and a crystalline state based on applied temperature. In its amorphous state, the chalcogenide molecules are disorganized, and the material becomes highly resistive. In its crystalline state, the chalcogenide molecules are ordered, and the material becomes less resistive. For the purpose of the memory bit, the amorphous state of the chalcogenide may be read as a logic '0' and the crystalline state of the chalcogenide may be read as a logic '1'.

Either or both of first layer stack 108 and second layer stack 110 can include one or more other conductive layers. For example, first layer stack 108 can include a first conductive layer 116 and a second conductive layer 118 to provide enhanced ohmic contact to selector layer 112. In an embodiment, conductive layers 116 and 118 comprise carbon.

Second layer stack 110 may include conductive layers 120 and 122 which may provide electrode contacts to a phase change layer 114. Another conductive layer 124 may be provided as part of second layer stack 110. In some embodiments, conductive layer 124 comprises carbon.

As noted above, sidewalls of at least phase change layer 114 are protected by a multi-layer dielectric structure 109 that can include a first dielectric layer 126 and a second dielectric layer 128. In some such cases, multi-layer dielectric structure 109 is above and not on sidewalls of selector layer 112. According to some embodiments, second dielectric layer 128 comprises a high-k dielectric material. Second dielectric layer 128 effectively protects phase change layer 114 from lateral erosion and physical vertical etch and provides etch selectivity during the fabrication process (e.g., during the final partial etch). Further example details of multi-layer dielectric structure 109 and its fabrication process will be discussed with respect to FIG. 3.

Figures 1B, 1C:
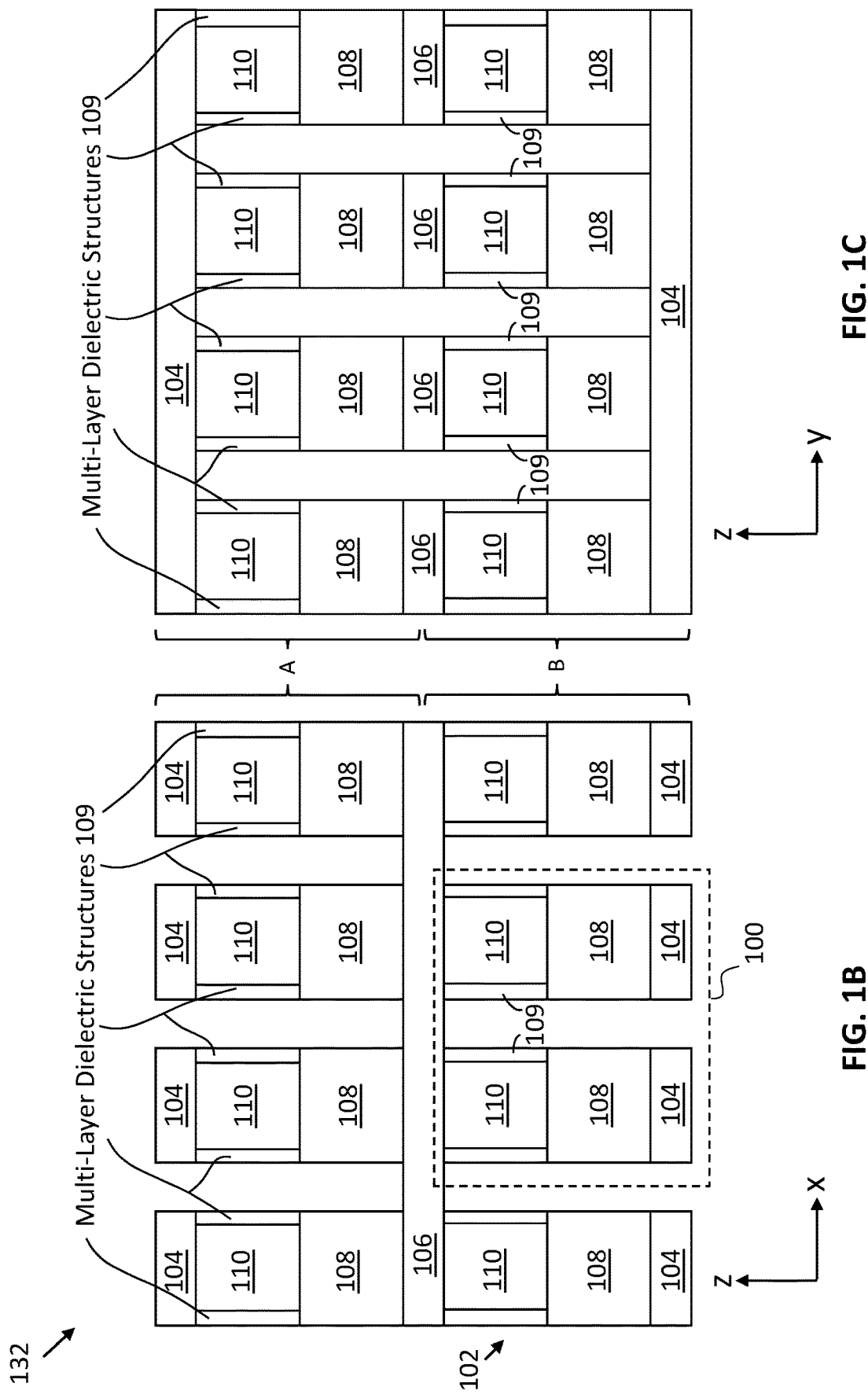
FIGS. 1B and 1C illustrate orthogonal cross-section views of a stacked array of memory cells, in accordance with some embodiments of the present disclosure.

FIGS. 1B and 1C illustrate cross-section views of a memory array 132, according to some embodiments. Portion 100 of memory array 132 includes two memory cells 102 of the plurality of arrayed memory cells. The cross-section views are taken orthogonally to one another in memory array 132. Memory array 132 includes a plurality of memory cells 102 arranged in arrays A and B stacked in the Z-direction to form a 3D memory structure. The array includes an ordered arrangement of rows and columns of memory cells 102 in the XY plane as illustrated in FIGS. 1B and 1C. Other ordered arrangements are possible as well. Each memory cell 102 generally includes a first stack of layers 108 with one or more selector layers and a second stack of layers 110 with one or more phase change layers. According to some embodiments, sidewalls of each of second stack of layers 110 are protected by multi-layer dielectric structure 109.

As can be further seen, memory array 130 includes a plurality of word lines 104 and bit lines 106 used to address a particular memory cell 102 with the stack. As noted in this example, word lines 104 run orthogonal to bit lines 106 and memory array 130 alternates between word lines 104 and bit lines 106 in the Z-direction. With reference to FIGS. 1B and 1C, word lines 104 run along the Y-direction (into and out of the page in FIG. 1B), and bit lines 106 run along the X-direction (into and out of the page in FIG. 1C).

It will be appreciated that the number of memory cells 102 illustrated is purely used as an example, and that any number of memory cells 102 can be used in each tier, and that any number of tiers in the Z-direction can be used as well. According to some embodiments, the height in the Z-direction of a given memory cell 102 is between about 100 nm and about 150 nm. According to some embodiments, the width in either the X-direction or the Y-direction of a given memory cell 102 is between about 10 nm and about 20 nm. The width may be the same in both the X-direction and the Y-direction. Any number of memory cell geometries can be utilized, as will be appreciated.

Figure 2:
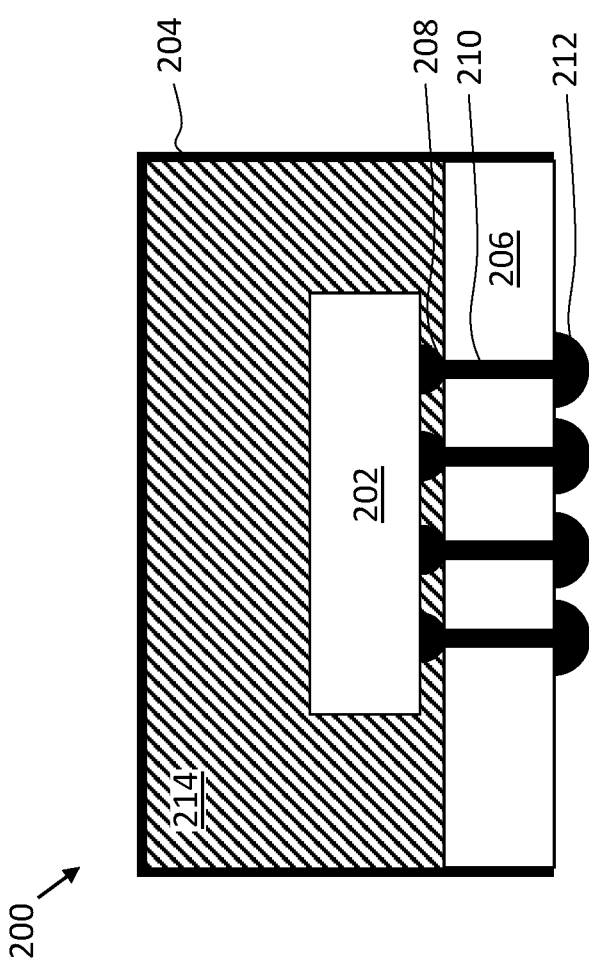
FIG. 2 illustrates a cross-section view of a chip package containing one or more memory dies, in accordance with some embodiments of the present disclosure.

FIG. 2 illustrates an example embodiment of a chip package 200. As can be seen, chip package 200 includes one or more dies 202. Chip package 200 may be a memory device when one or more dies 202 include one or more memory dies, whether it be a dedicated memory die, or some other die that has a memory portion juxtaposed to other functional circuitry of the die (e.g., such as a processor that has on-board memory). Die 202 may include any number of memory arrays 132 as well as any other circuitry used to interface with the memory arrays, in some example configurations. In still other embodiments, memory arrays 132 may be present on one die 202 and other circuitry used to interface (e.g., cell selection circuitry, readout circuitry, and programming circuitry) with die 202 is on another die within chip package 200.

As can be further seen, chip package 200 includes a housing 204 that is bonded to a package substrate 206. The housing 204 may be any standard or proprietary housing, and provides, for example, electromagnetic shielding and environmental protection for the components of chip package 200. The one or more dies 202 may be conductively coupled to a package substrate 206 using connections 208, which may be implemented with any number of standard or proprietary connection mechanisms, such as solder bumps, ball grid array (BGA), pins, or wire bonds, to name a few examples. Package substrate 206 may be any standard or proprietary package substrate, but in some cases includes a dielectric material having conductive pathways (e.g., including conductive vias and lines) extending through the dielectric material between the faces of package substrate 206, or between different locations on each face. In some embodiments, package substrate 206 may have a thickness less than 1 millimeter (e.g., between 0.1 millimeters and 0.5 millimeters), although any number of package geometries can be used. Additional conductive contacts 212 may be disposed at an opposite face of package substrate 206 for conductively contacting, for instance, a printed circuit board. One or more vias 210 extend through a thickness of package substrate 206 to provide conductive pathways between one or more of connections 208 to one or more of contacts 212. Vias 210 are illustrated as single straight columns through package substrate 206 for ease of illustration, although other configurations can be used (e.g., damascene, dual damascene, through-silicon via). In still other embodiments, vias 210 are fabricated by multiple smaller stacked vias, or are staggered at different locations across package substrate 206. In the illustrated embodiment, contacts 212 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 212, to inhibit shorting.

In some embodiments, a mold material 214 may be disposed around the one or more dies 202 included within housing 204 (e.g., between dies 202 and package substrate 206 as an underfill material, as well as between dies 202 and housing 204 as an overfill material). Although the dimensions and qualities of the mold material 214 can vary from one embodiment to the next, in some embodiments, a thickness of mold material 214 is less than 1 millimeter. Example materials that may be used for mold material 214 include epoxy mold materials, as suitable. In some cases, the mold material 214 is thermally conductive, in addition to being electrically insulating.

Fabrication Procedure

FIGS. 3A-3F illustrate cross-section views of different stages of a fabrication process for portion 100 of memory array 132, according to some embodiments of the present disclosure. The various layers and structures illustrated in FIGS. 3A-3F are not intended to be drawn to scale, but are illustrated in a particular fashion for clarity. Some intermediate processes may be performed that are not explicitly illustrated, as will be appreciated (e.g., such as polishing and cleaning processes, or other standard processing). In other embodiments, not all illustrated layers are used and/or additional layers may be included. For instance, rather than having two conductive layers (e.g., 316 and 318), some embodiments may only have one conductive layer (e.g., 316 or 318). Likewise, the ohmic contact structure between selector layer 312 and phase change layer 314 may be omitted in some embodiments or integrated into one or both of switching and phase change material structures.

Figure 3A:
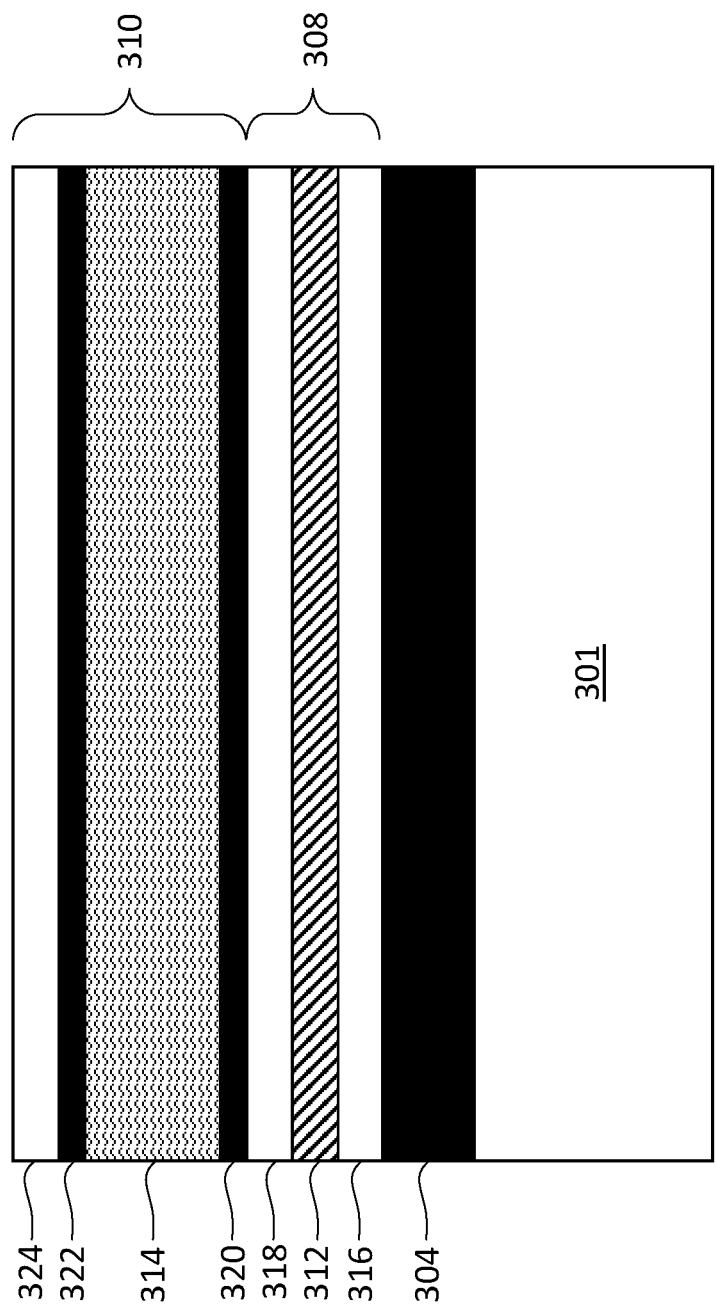
FIGS. 3A-3F illustrate cross-section views of a fabrication process for a portion of a memory device, in accordance with some embodiments of the present disclosure.

FIG. 3A illustrates a stack of material layers deposited over a substrate 301, according to some embodiments. Substrate 301 may be any suitable substrate material for forming additional material layers over it. In some embodiments, substrate 301 includes a semiconductor material such as silicon, germanium, silicon germanium, gallium arsenide, or indium phosphide. Substrate 301 may include one or more insulating layers at its top surface, such as silicon oxide or silicon nitride, or buried below a top semiconductor layer such as in semiconductor-on-insulator substrate configurations.

A first conductive layer 304 may be deposited over the top surface of substrate 301. First conductive layer 304 may be a metal, such as tungsten, silver, aluminum, titanium, cobalt, or an alloy. In some embodiments, first conductive layer 304 has a sufficient thickness (e.g., 1 to 50 nm thick) to propagate signals after first conductive layer 304 has been patterned into word lines or bit lines. As can be further seen, a second conductive layer 316 may be deposited, followed by at least one selector layer 312, and a third conductive layer 318. Each of conductive layers 316 and 318 may include any conductive material that enhances the ohmic contact being made to selector layer 312. In one such example embodiment, conductive layers 316 and 318 comprise carbon. Other embodiments may not include conductive layers 316 and 318.

Each of layers 316, 312, and 318 may collectively be considered a first stack of layers 308 that is deposited before the deposition of phase change layer 314. First stack of layers 308 can include any number of conductive layers and at least one selector layer 312.

A second stack of layers 310 may be deposited over first stack of layers 308 and can include any number of conductive layers and at least one phase change layer 314. According to some embodiments, second stack of layers 310 includes one or more conductive layers that provide electrode contacts to phase change layer 314. A fourth conductive layer 320 may be deposited over third conductive layer 318 to provide an electrode contact to phase change layer 314. Fourth conductive layer 320 may be a metal, such as tungsten or other suitable contact metals or alloys (such as those previously mentioned).

According to some embodiments, one or more additional conductive layers are deposited over phase change layer 314 that provide a second electrode contact to phase change layer 314. For example, a fifth conductive layer 322 may be deposited followed by a sixth conductive layer 324. Fifth conductive layer 322 may be a metal, such as tungsten. Sixth conductive layer 324 may comprise carbon. In some embodiments, each of conductive layers 304, 320, and 322 comprise the same material and each of conductive layers 316, 318, and 324 comprise the same material.

The deposition of the various material layers over substrate 302 may be considered as the deposition of a first stack of layers 308, followed by the deposition of a second stack of layers 310. As noted above, other material layers may be deposited during, before, or after the deposition of any of the material layers discussed above depending on the application. As will be appreciated and further explained below, layer stacks 308 and 310 are only designated to facilitate discussion herein, and not to implicate any structural limitation to the present disclosure. In more detail, the sidewalls of first layer stack 308 do not need to be exposed when the multi-layer liner (discussed in turn with reference to FIG. 3C) is being provisioned on exposed sidewalls of phase change layer 314. That said, in some embodiments, at least some of the sidewall of first layer stack 308 may be exposed during deposition of the multi-layer liner, and therefore be covered by that liner structure. For instance, in some such embodiments, at least part of layer 318 may have its sidewalls covered by the multi-layer liner. The various layers may be deposited using standard deposition techniques, such as chemical vapor deposition (CVD), physical vapor deposition (PVD), and atomic layer deposition (ALD) techniques.

Figure 3B:
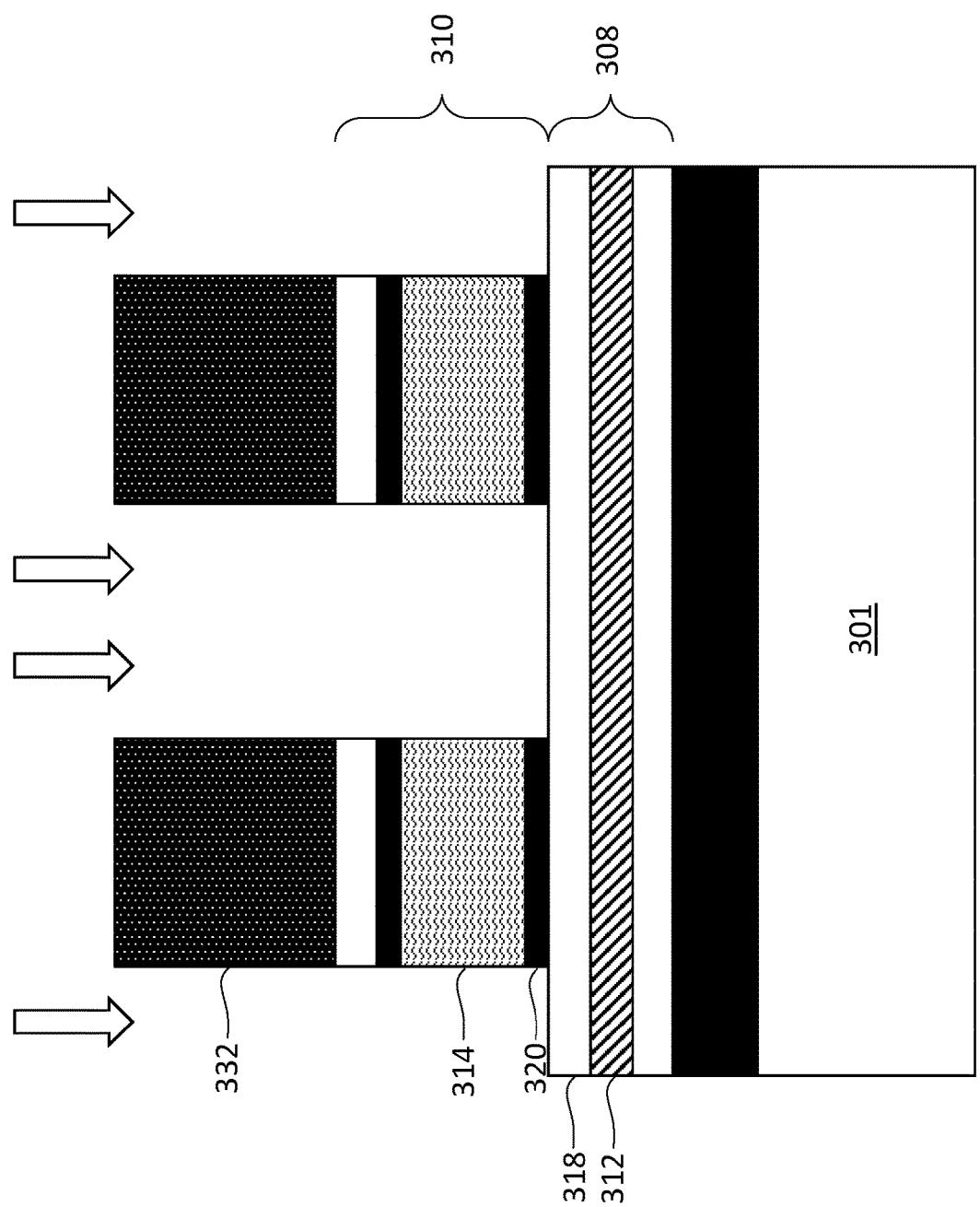
Figure 3C:
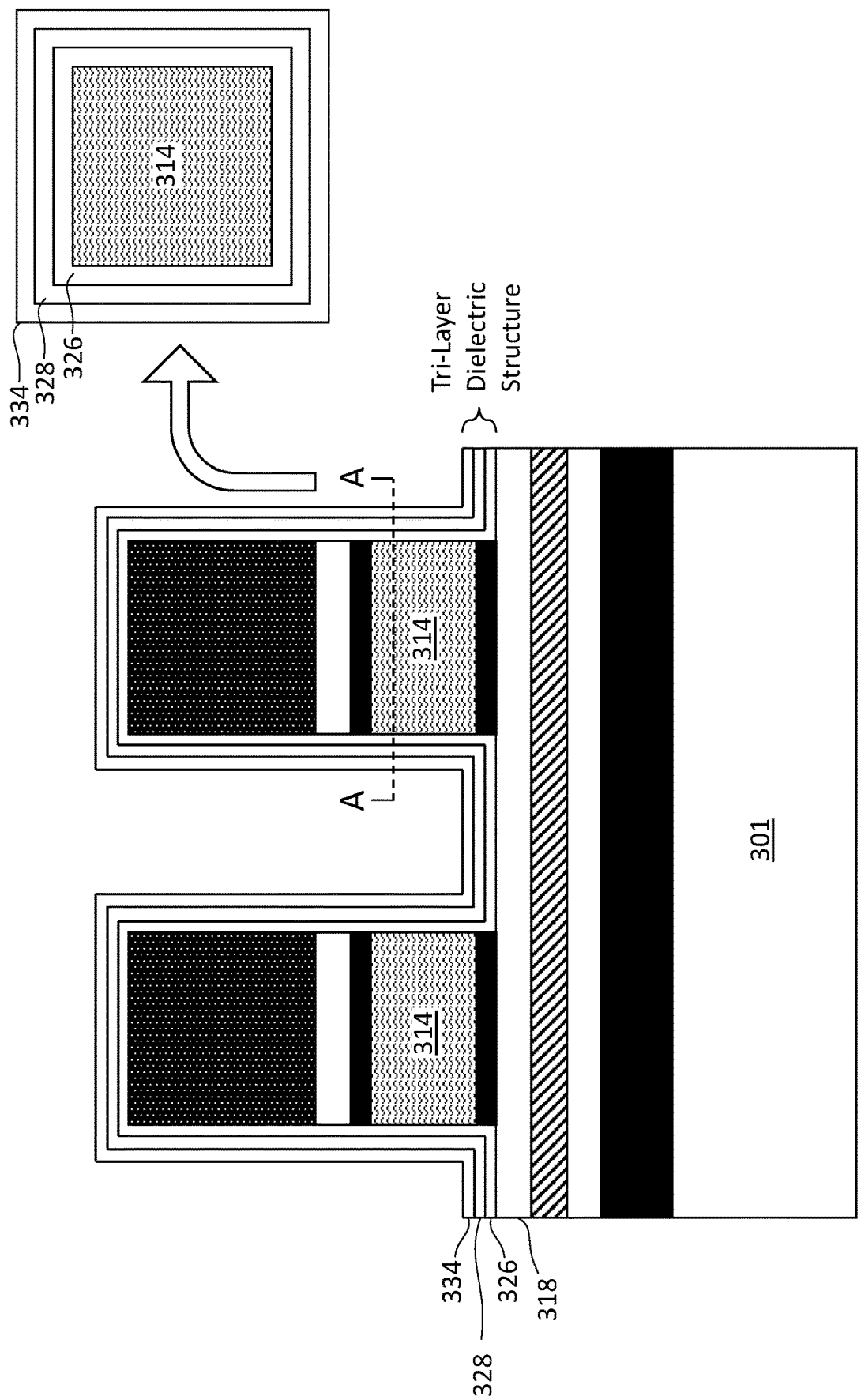

After all desired layers are provisioned on substrate 301, the overall stacked structure can then be etched into an array of individual stacks that can be used for memory cells. This etch process can be divided into two main parts: a first partial etch that etches to the bottom of or just past phase change layer 314, and a final partial etch that etches at least below selector layer 312, according to some embodiments. FIG. 3B illustrates a first partial etching process being performed that etches through a thickness of at least second stack of layers 310 and phase change layer 314, according to an embodiment. A mask layer 332 may be deposited and patterned using standard lithography techniques to expose particular regions to the etching process, as variously shown in FIG. 3B. Mask layer 332 may be a dielectric material, such as silicon oxide or silicon nitride. In some embodiments, the etch is carried out by a directional (anisotropic) dry etch, although wet etching can be used as well (albeit less directional) or a combination of wet and dry etching, in still other embodiments. Note that the etching process can cause, for instance, rounding of the top corners of mask layer 332 and/or rounding at the trench bottom, given real-world process limitations, as will be appreciated. The arrows indicate the general direction of a standard anisotropic dry etching process, according to one embodiment.

According to an embodiment, the first partial etch process continues through the thickness of phase change layer 314 and etches at least a portion of fourth conductive layer 320. In some embodiments, the etch may continue partially into a thickness of third conductive layer 318. In such an embodiment, the etch process is stopped before any etching of selector layer 312 occurs. This may be done, for instance, to avoid exposing phase change layer 314 to selector layer 312. This may be desirable because dopants used within selector layer 312 can contaminate phase change layer 314.

To protect phase change layer 314 from contamination during the final partial etch process when etching through at least one selector layer 312, a series of protective dielectric layers are deposited over the exposed sidewalls of phase change layer 314, according to the present disclosure. In more detail, and as illustrated in the example embodiment of FIG. 3C, a tri-layer dielectric structure is deposited to protect sidewalls of at least phase change layer 314, according to some embodiments. As can be seen, the tri-layer dielectric structure of this example embodiment includes first dielectric layer 326, a second dielectric layer 328, and a third dielectric layer 334.

A top-down view is also illustrated taken across the dashed cross-section line A-A. The top-down view shows how each of first dielectric layer 326, second dielectric layer 328, and third dielectric layer 334 may be deposited over all exposed sidewalls (e.g., all four sidewalls) of phase change layer 314.

First dielectric layer 326 is deposited over sidewalls of at least phase change layer 314. According to some embodiments, first dielectric layer 326 also blankets any exposed portions of third conductive layer 318, and any other exposed layer surfaces that were previously exposed during the first partial etch process illustrated in FIG. 3B. In an embodiment, first dielectric layer 326 includes silicon nitride due to its good adhesion properties to most other materials. First dielectric layer 326 may be deposited, for example, using a plasma enhanced chemical vapor deposition (PECVD) process to a planar thickness of between about 10 Å and about 50 Å. As used herein, the term "planar thickness" refers to a thickness of a layer measured in reference to a plane that is parallel to a surface of substrate 301. A layer's planar thickness contrasts with its sidewall thickness. While the planar thickness of a deposited layer is considered to be relatively consistent across the substrate surface (at least far from the edges of the substrate), the sidewall thickness can vary depending on where along the sidewall the thickness is measured and what deposition process is used as well as the impact on that sidewall thickness by any subsequent etching.

Second dielectric layer 328 is deposited over the first dielectric layer 326, according to an embodiment. Second dielectric layer 328 includes a high-k dielectric material, according to an embodiment. Examples of high-k materials include oxides of one or more of the following elements: lithium (Li), boron (B), magnesium (Mg), aluminum (Al), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), strontium (Sr), yttrium (Y), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), samarium (Sm), europium (Eu), gadolinium (Gd), dysprosium (Dy), holmium (Ho), erbium (Er), thulium (Tm), ytterbium (Yb), lutetium (Lu), hafnium (Hf), tantalum (Ta), iridium (Ir), platinum (Pt), lead (Pb), and bismuth (Bi). In some specific example embodiments, second dielectric layer 326 includes hafnium oxide (HfO), zirconium oxide (ZrO), or aluminum oxide (AlO). Other examples of high-k dielectrics include hafnium silicon oxide, lanthanum aluminum oxide, zirconium silicon oxide, barium strontium titanium oxide, barium titanium oxide, strontium titanium oxide, lead scandium tantalum oxide, and lead zinc niobate. In a more general sense, a high-k dielectric is a dielectric material having a dielectric coefficient greater than that of silicon dioxide. The high-k nature of the second dielectric layer 328 allows it to have a highly selective etch rate during the final partial etch process, such that the etch rate of second dielectric layer 328 is much lower (e.g., at least 3× lower, or at least 10× lower, or at least 100× lower) than the etch rate through the other exposed material layers. In some other embodiments, second dielectric layer 328 includes a silicate having one or more of the following elements: Li, B, Mg, Al, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi. A silicate generally includes silicon, oxygen, and any additional elements (if present). According to some embodiments, second dielectric layer 328 is deposited using an atomic layer deposition (ALD) process, such as a thermal ALD process, to a planar thickness of between about 5 Å and about 25 Å. Due to the ALD deposition technique, the thickness of second dielectric layer 328 may be relatively uniform and conformal over the sidewalls and planar surfaces. The deposition temperature may be, for example, between about 150° C. and 300° C.

Note that in some cases, such as where first dielectric layer 326 is deposited with CVD, and second dielectric layer 328 is deposited with ALD, first dielectric layer 326 may be thicker at the top of the memory cell stack than it is at the bottom near the substrate (e.g., due to pinch-off), while second dielectric layer 328 may be relatively uniform along its entire length. In a more general sense, the degree to which a given layer's thickness varies or is otherwise non-uniform along that layer's length may depend on factors such as the specific deposition process employed and the aspect ratio of trenches between the stacks.

Third dielectric layer 334 is deposited over second dielectric layer 328, according to an embodiment. Third dielectric layer 334 may include, for example, silicon oxide, according to an embodiment. In still other embodiments, third dielectric layer 334 includes a silicate including one or more of the following elements: Li, B, Mg, Al, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi. Third dielectric layer 334 may include the corresponding silicate based on a metal included in second dielectric layer 328. For example, if second dielectric layer 328 is hafnium oxide, then third dielectric layer 334 can include hafnium silicon oxide. Numerous other example silicates will be appreciated in light of this disclosure.

In some examples, third dielectric layer 334 is a sacrificial layer and is expected to be consumed, or at least partially consumed, during the subsequent final partial etch process. According to some embodiments, third dielectric layer 334 is deposited using an ALD process, such as a pressure enhanced ALD (PEALD) process, to a planar thickness of between about 10 Å and about 30 Å. Note the thickness of the third dielectric layer 334 atop the stacks may be thicker than the thickness of the third dielectric layer 334 at the bottom of the trenches.

Figure 3D:
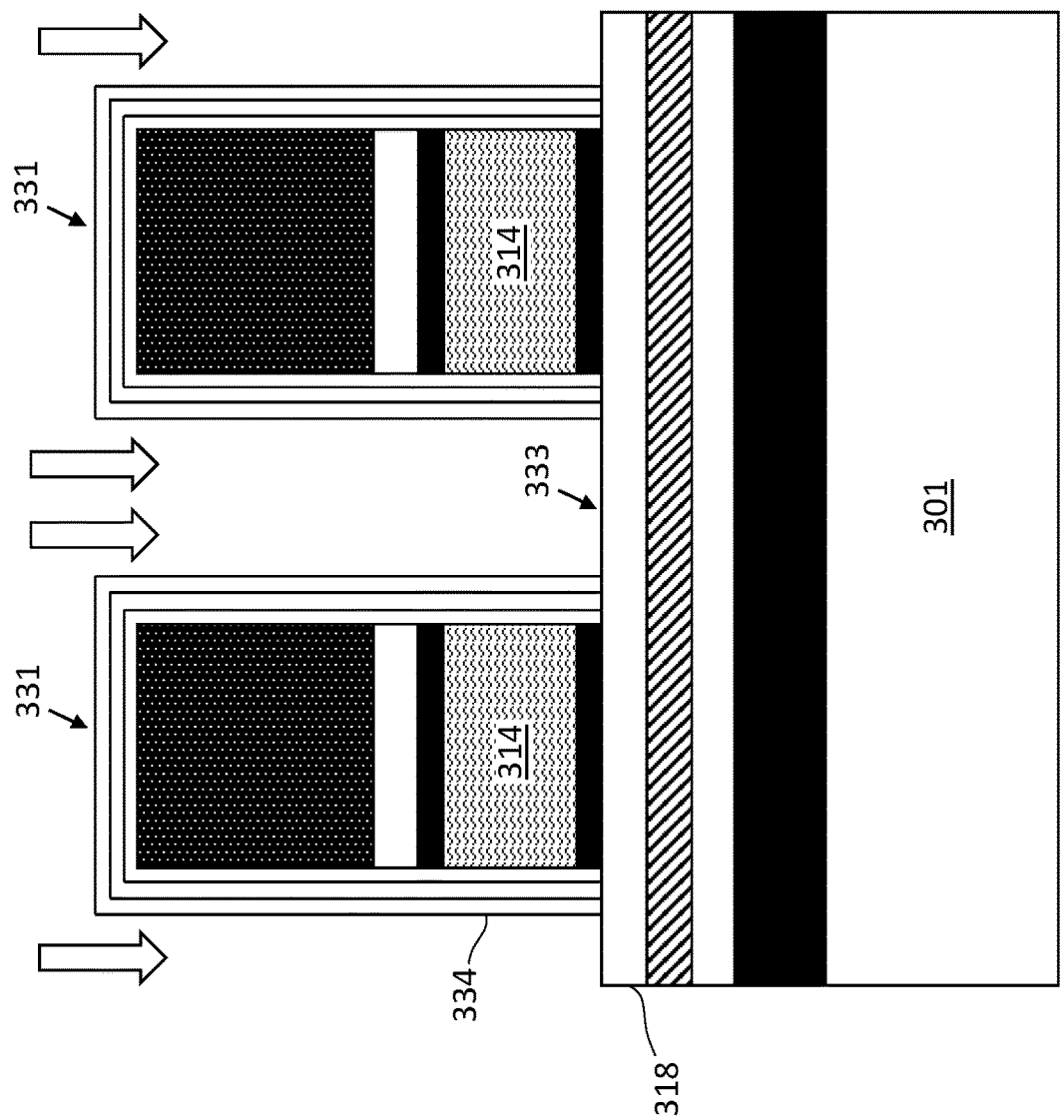

FIG. 3D illustrates the beginning of the final partial etch, which includes a so-called break through process represented by the arrows that punches through a planar thickness of each of first dielectric layer 326, second dielectric layer 328, and third dielectric layer 334, according to an embodiment. This etch can also be implemented, for example, using a standard anisotropic dry etch, similar to the first partial etch, although the etch properties can be tuned as the materials being etched change from layer to layer. Although the planar thickness of the tri-layer dielectric structure is etched through, the etch rate through the sidewall thickness of the tri-layer dielectric structure is much slower due to the anisotropic nature of the dry etch process. In addition, a fatter thickness of the third dielectric layer 334 on the top of the stacks takes longer to erode than the relatively thinner thickness of third dielectric layer 334 at the trench bottom between stacks, so break-through in the trench bottom prior to breakthrough at the top of stack is more likely in such cases. In any case, the relatively thick mask layer 332 will continue to protect the top of stacks if break through occurs in that top stack location as well. In some example embodiments, for instance, a top surface 331 of the tri-layer dielectric structure may also be removed during the final partial dry etch process. In some such embodiments, only the third dielectric layer 334 is removed, or partially removed, from top surface 331 during the etch process to punch through the planar thickness of each of first dielectric layer 326, second dielectric layer 328, and third dielectric layer 334 at the bottom 333 of the stack trenches.

Figure 3E:
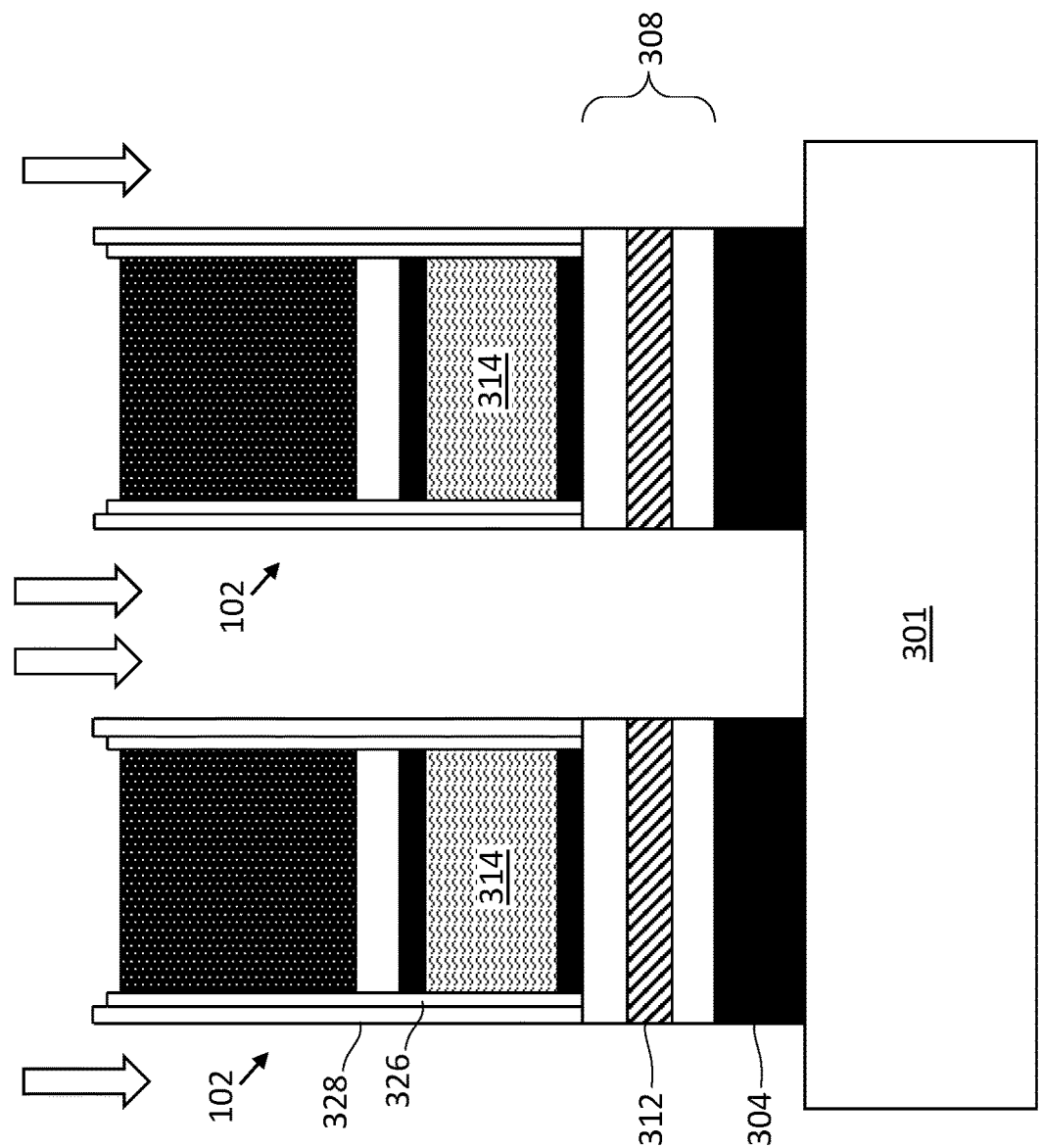

FIG. 3E illustrates the continuation of the final partial etch process from FIG. 3D where at least a portion of first layer stack 308 is etched through, according to some embodiments. In one example, the entire thickness of first layer stack 308 is etched through, as well as a thickness of first conductive layer 304 down to a surface of substrate 302. In some examples, the etch process continues until at least a thickness of at least one selector layer 312 is etched through. According to some embodiments, the final partial etch process through first layer stack 308 also removes third dielectric layer 334 on the top (to the extent there is any left) as well as the third dielectric layer 334 on the sidewalls of the stacks, thus exposing second dielectric layer 328. Due to its high etch selectively, second dielectric layer 328 survives the final partial etch and protects phase change layer 314 from harm. After the final partial etch process is completed, second dielectric layer 328 may remain along with first dielectric layer 326 over the sidewalls of phase change layer 314. Note that second dielectric layer 328 remains over the sidewalls of at least phase change layer 314 in the final structure, according to some embodiments. In some embodiments, the final partial etch process through first layer stack 308 and first conductive layer 304 forms first conductive layer 304 into word lines.

Figure 3F:
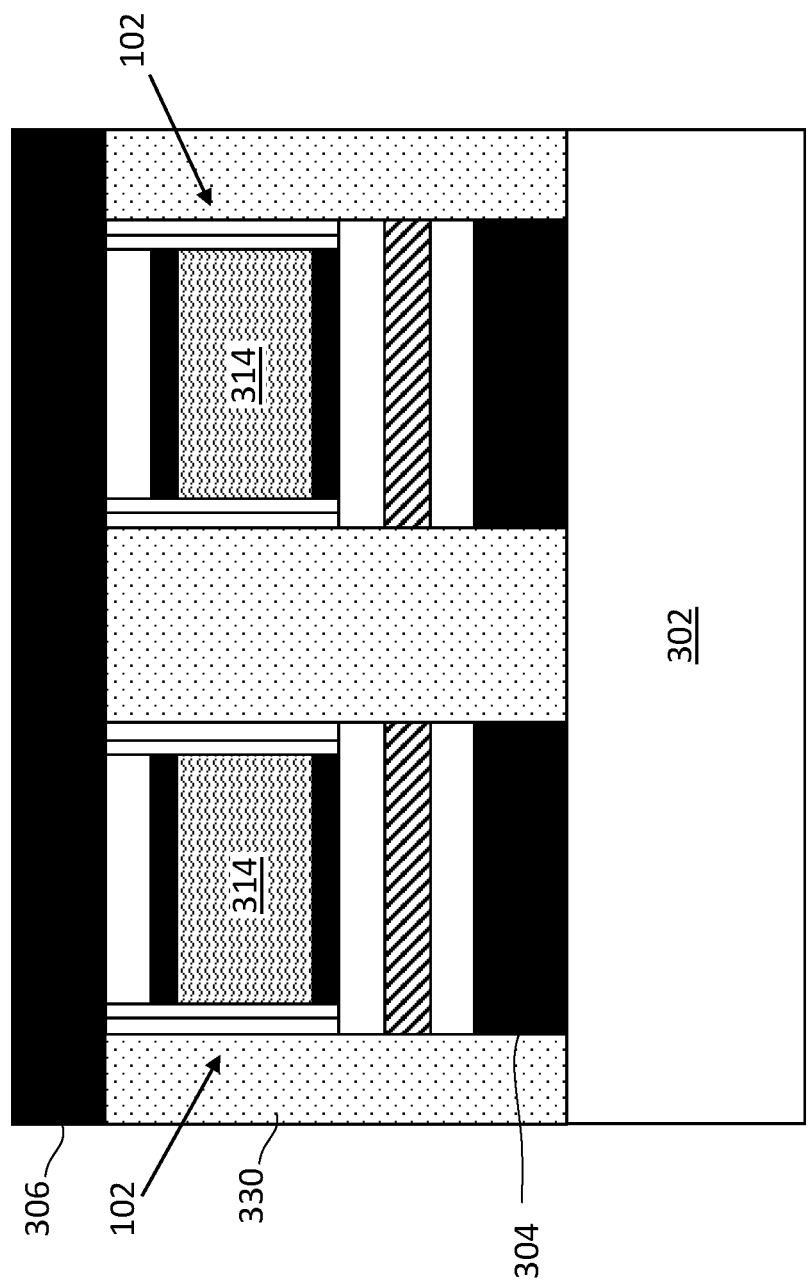

FIG. 3F illustrates the competition of a first set of memory cells 102, according to some embodiments. A fill dielectric 330 is deposited between and around the various memory cells, and over the multi-dielectric layer structure on the sidewalls of phase change layer 314. Fill dielectric 330 may be deposited to fill any remaining area between adjacent memory cells. In some embodiments, fill dielectric 330 is silicon oxide and is deposited using a PECVD process. After depositing fill dielectric 330, a top surface of the structure may be planarized using a chemical mechanical polishing (CMP) process. In some embodiments, this CMP process also removes mask layer 332. In some embodiments, the structure may be planarized down to any one of the conductive layers over phase change layer 314.

Following the planarization, a conductive material layer 306 is deposited over memory cells 102. Conductive material layer 306 may be patterned to form bit lines that run orthogonal to word lines 304. In some embodiments, conductive material layer 306 is a metal, such as tungsten, silver, aluminum, titanium, cobalt, or an alloy. Although not explicitly illustrated for clarity, additional one or more dielectric layers may be deposited over the sidewalls of memory cells 102 before the deposition of fill dielectric 330.

According to some embodiments, the fabrication process illustrated in FIGS. 3A-3F results in the formation of an array of memory cells 102, each having a phase change layer 314 and at least one selector layer 312. In some example embodiments, memory cells 102 have a height to width aspect ratio of about 10:1 and a height between about 100 nm and about 150 nm.

It should be appreciated that only two memory cells 102 are depicted for clarity. In some embodiments, an array of any number of memory cells are fabricated using the fabrication procedure described with reference to FIGS. 3A-3F. Additionally, such a fabrication process may be repeated for each tier of memory cells to form a stacked 3D memory array, such as shown in FIGS. 1B-C. In some embodiments, the deposition order of second dielectric layer 328 and third dielectric layer 334 is switched such that the dielectric layer having the high-k material is the outer-most layer of the tri-layer structure. In some such cases, an additional (fourth layer) of dielectric material similar to the material used for the third dielectric layer 334 is provided over the second dielectric layer 328 material. In still other embodiments, multiple tri-layer structures can be provided on top of each other, so as to facilitate a desired degree of etch selectivity and protection to the phase change material.

Figure 4:
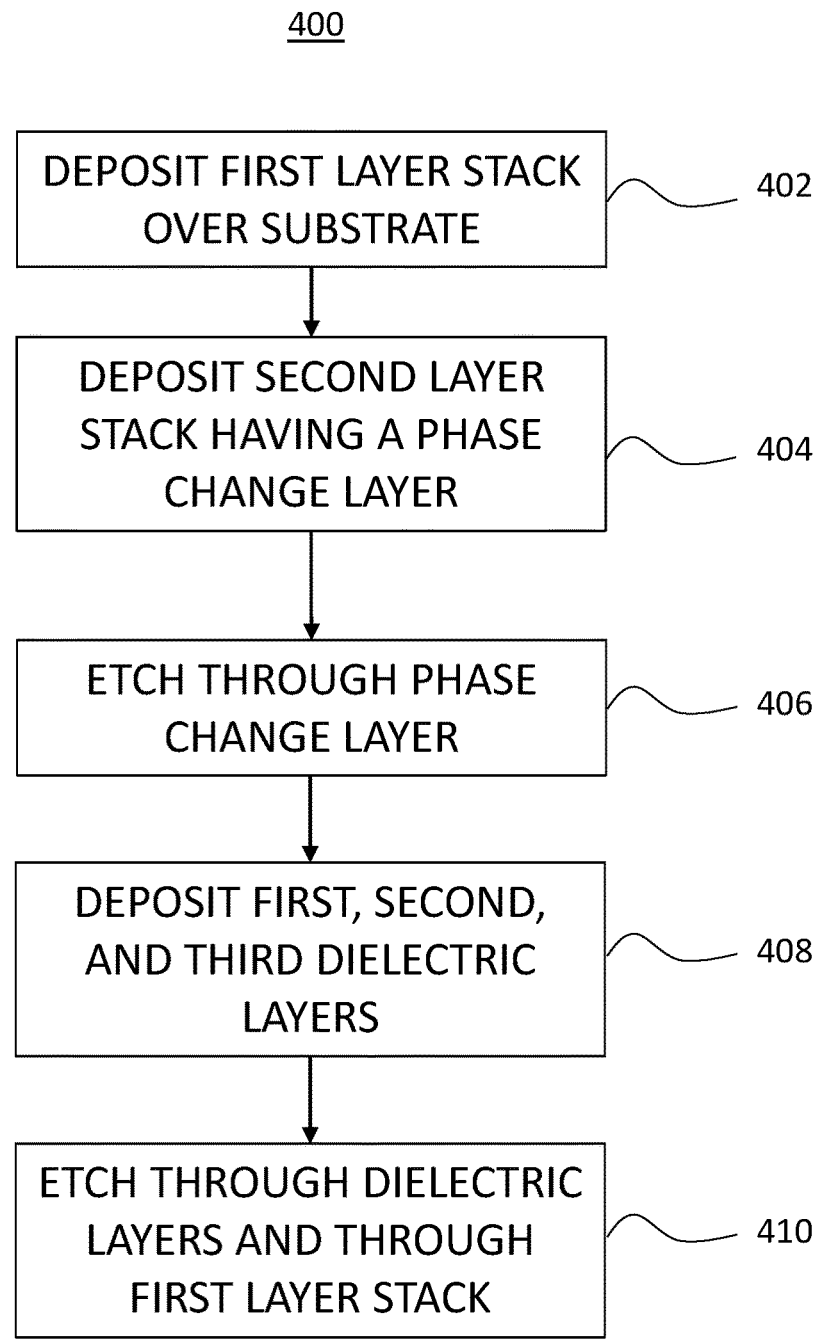
FIG. 4 is a flowchart of a fabrication process for a memory device, in accordance with an embodiment of the present disclosure.

FIG. 4 is a flow chart of a method 400 for fabricating a memory device that includes an array of memory cells having phase change material, according to an embodiment. Various example operations of method 400 may be illustrated in FIGS. 3A-3F. However, the correlation of the various operations of method 400 to the specific components illustrated in FIGS. 3A-3F is not intended to imply any structural and/or use limitations. Rather, FIGS. 3A-3F provide one example embodiment of method 400. Other operations may be performed before, during, or after any of the operations of method 400.

Method 400 begins at operation 402 where a first layer stack is provisioned over a substrate. The first layer stack may include any number of conductive layers and at least one selector layer. The selector layer may be sandwiched between one or more of the conductive layers in the first layer stack. The selector layer may include chalcogenide doped with arsenic, in one example, but any number of known or proprietary switching materials can be used. Note that the various layers can be deposited in sequence over a substrate, such as discussed with respect to FIG. 3A. In other example embodiments, a pre-formed first layer stack may be bonded to a substrate.

Method 400 continues with operation 404 where a second layer stack having at least one phase change layer is deposited on the first layer stack. The phase change layer may include a metalloid alloy, such as chalcogenide, but any number of known or proprietary phase change materials can be used, as will be appreciated in light of this disclosure. In some embodiments, the second layer stack includes one or more conductive layers on either side of the phase change layer.

Method 400 continues with operation 406 where a thickness of at least the phase change layer is etched through using a dry etching process. The etching process may also etch through a thickness of the second layer stack, and a portion of the first layer stack. As will be appreciated, because the etch does not pass through the entire multi-layer stack, it is referred to as a first partial etch. In some embodiments, the etching process of operation 406 does not etch through any portion of the at least one selector layer in the first layer stack.

Method 400 continues with operation 408 where a multi-layer dielectric structure is formed that includes an etch selective material that is, for example, highly conformal and that will protect the phase change layer from subsequent etching. In one example embodiment, operation 408 includes depositing a first, a second, and a third dielectric layer. The three dielectric layers are deposited sequentially over sidewalls of at least the phase change layer, according to an embodiment. Each of the three dielectric layers may be deposited using a different deposition technique. In some examples, two or more of the three dielectric layers are deposited using the same deposition technique.

In some embodiments, the first deposited dielectric layer is silicon nitride, the second deposited dielectric layer is a high-k material or a metal silicate material, and the third deposited dielectric layer is silicon oxide. The second dielectric layer may include oxides comprising one or more of the following elements: Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi, or silicates of any of the listed elements. In some specific example cases, the second deposited dielectric layer includes hafnium oxide (HfO), zirconium oxide (ZrO), or aluminum oxide (AlO). The previous discussion with respect to high-k materials is equally applicable here.

Method 400 continues with operation 410 where another etch process is performed to etch through a planar portion of the three dielectric layers and through at least a portion of the first layer stack, according to an embodiment. The etch process performed in operation 410 may use the same etch technique as the etch process performed in operation 406, albeit with different parameters to etch through the various material layers. As will be further appreciated, because the etch does not pass through the entire multi-layer stack, it is referred to as a final partial etch. Due to the anisotropic nature of the etch process in operation 410, planar regions of the three dielectric layers are etched through while the sidewall regions of the three dielectric layers are etched much more slowly. However, as previously explained, while continuing to etch through the first layer stack, the lateral etch rate may be high enough to consume the third deposited dielectric layer over the sidewall regions. The second dielectric layer (having the high-k material, according to some embodiments) exhibits a high etch rate selectivity and thus does not become consumed on the sidewall regions as the etch continues through the first layer stack toward the substrate, according to some embodiments. Accordingly, at the end of the etch in operation 410, both the first dielectric layer and at least a portion of the second dielectric layer remain on the sidewalls of at least the phase change layer, thus protecting the phase change layer throughout the etch process.

Example Electronic Device

FIG. 8 illustrates an example electronic device 500 that may include one or more memory devices such as the embodiments disclosed herein. In some embodiments, electronic device 500 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

Figure 5:
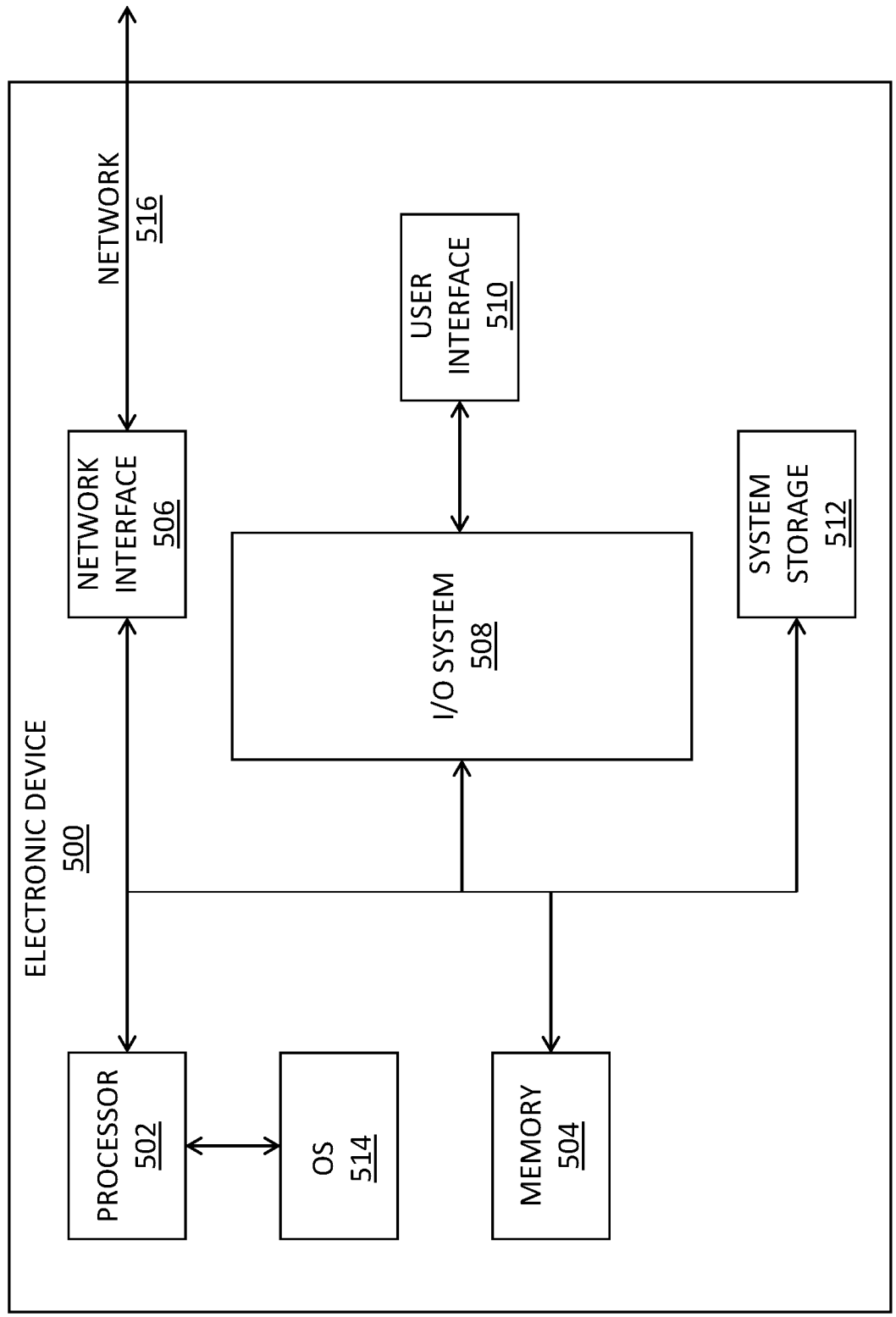
FIG. 5 illustrates an example electronic device that can include one or more of the embodiments of the present disclosure.

In some embodiments, electronic device 500 may comprise any combination of a processor 502, a memory 504, a network interface 506, an input/output (I/O) system 508, a user interface 510, and a storage system 512. As can be further seen, a bus and/or interconnect is also provided to allow for communication between the various components listed above and/or other components not shown. Electronic device 500 can be coupled to a network 516 through network interface 506 to allow for communications with other computing devices, platforms, or resources. Other componentry and functionality not reflected in the block diagram of FIG. 5 will be apparent in light of this disclosure, and it will be appreciated that other embodiments are not limited to any particular hardware configuration.

Processor 502 can be any suitable processor and may include one or more coprocessors or controllers to assist in control and processing operations associated with electronic device 500. In some embodiments, processor 502 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 504 can be implemented using any suitable type of digital storage including, for example, flash memory and/or random access memory (RAM). In some embodiments, memory 504 may include various layers of memory hierarchy and/or memory caches. Memory 504 may be implemented as a volatile memory device such as, but not limited to, a RAM, dynamic RAM (DRAM), or static RAM (SRAM) device. Storage system 512 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 512 may comprise technology to increase the storage performance enhanced protection for valuable digital media when multiple hard drives are included. According to some embodiments of the present disclosure, either or both memory 504 and storage system 512 includes one or more memory arrays 132 having memory cells 102 fabricated using the processes discussed herein. According to some embodiments of the present disclosure, either or both memory 504 and storage system 512 may be incorporated in a chip package 200 and bonded to a printed circuit board (PCB) along with one or more other devices.

Processor 502 may be configured to execute an Operating System (OS) 514 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 506 can be any appropriate network chip or chipset which allows for wired and/or wireless connection between other components of electronic device 500 and/or network 516, thereby enabling electronic device 500 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 508 may be configured to interface between various I/O devices and other components of electronic device 500. I/O devices may include, but not be limited to, a user interface 510. User interface 510 may include devices (not shown) such as a display element, touchpad, keyboard, mouse, and speaker, etc. I/O system 508 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 502 or any chipset of electronic device 500.

It will be appreciated that in some embodiments, the various components of the electronic device 500 may be combined or integrated in a system-on-a-chip (SoC) architecture. In some embodiments, the components may be hardware components, firmware components, software components or any suitable combination of hardware, firmware or software.

In various embodiments, electronic device 500 may be implemented as a wireless system, a wired system, or a combination of both. When implemented as a wireless system, electronic device 500 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, electronic device 500 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

Example 1 is a memory device. The memory device includes a first memory cell in an array, a second memory cell in the array, a first dielectric structure, and a second dielectric structure. The first memory cell includes a first layer of phase change material, the first layer including a first sidewall. The second memory cell is laterally adjacent but spaced from the first memory cell. The second memory cell includes a second layer of the phase change material, the second layer including a second sidewall that faces the first sidewall. The first dielectric structure includes first and second dielectric layers with the first dielectric layer being on the first sidewall, and the second dielectric layer being on the first dielectric layer and comprising a high-k dielectric or a metal silicate. The second dielectric structure is on the second sidewall.

Example 2 includes the subject matter of Example 1, wherein the first memory cell further includes a first layer of switching material, and the first dielectric structure is not on the first layer of the switching material, and the second memory cell further includes a second conductive structure between the second layer of the switching material and the second layer of the phase change material.

Example 3 includes the subject matter of Example 2, wherein the first memory cell further includes a first conductive structure between the first layer of the switching material and the first layer of the phase change material, and the second memory cell further includes a second conductive structure between the second layer of the switching material and the second layer of the phase change material.

Example 4 includes the subject matter of Example 3, wherein the first dielectric structure is on at least one surface of the first conductive structure, and the second dielectric structure is on at least one surface of the second conductive structure.

Example 5 includes the subject matter of Example 4, wherein the first dielectric structure is on first and second surfaces of the first conductive structure, and the second dielectric structure is on first and second surfaces of the second conductive structure.

Example 6 includes the subject matter of any one of Examples 2-5, wherein the first memory cell further includes a first upper contact structure and a first lower contact structure, the first layer of the phase change material and the first layer of the switching material being between the first upper contact structure and the first lower contact structure, and the second memory cell further includes a second upper contact structure and a second lower contact structure, the second layer of the phase change material and the second layer of the switching material being between the second upper contact structure and the second lower contact structure.

Example 7 includes the subject matter of Example 6, wherein the first and second upper contact structure and the first and second lower contact structure comprises one or both of tungsten and carbon.

Example 8 includes the subject matter of any one of Examples 2-7, wherein the switching material comprises chalcogenide and a dopant.

Example 9 includes the subject matter of any one of Examples 1-8, wherein the first dielectric layer comprises a nitride and the high-k dielectric comprises oxygen and one of hafnium, zirconium, or aluminum. In some such examples, the high-k dielectric is hafnium oxide, or zirconium oxide, or aluminum oxide.

Example 10 includes the subject matter of any one of Examples 1-8, wherein the high-k dielectric comprises oxygen and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 11 includes the subject matter of any one of Examples 1-10, wherein the metal silicate comprises silicon, oxygen, and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 12 includes the subject matter of any one of Examples 1-11, wherein the phase change material comprises chalcogenide.

Example 13 is an integrated circuit that includes the memory device of any one of claims 1-12.

Example 14 is a printed circuit board that includes the integrated circuit of Example 13.

Example 15 is a memory chip that includes the memory device of any one of claims 1-12.

Example 16 is a memory device that includes an array of memory cells. Each of the memory cells includes a first stack of layers comprising at least one conductive layer and at least one selector layer, a phase change layer over the first stack of layers, one or more conductive layers over the phase change layer, a first dielectric layer on one or more sidewalls of at least the phase change layer, and a second dielectric layer on the first dielectric layer and over the one or more sidewalls of at least the phase change layer. The second dielectric layer comprises a high-k material or a metal silicate.

Example 17 includes the subject matter of Example 16, wherein one or more of the memory cells has a height to width aspect ratio of 10:1 or more.

Example 18 includes the subject matter of Example 16 or 17, wherein a memory cell of the array has a height between about 100 nm and about 150 nm.

Example 19 includes the subject matter of any one of Examples 16-18, wherein the high-k material comprises oxygen and one of hafnium, zirconium, or aluminum. In some such examples, the high-k dielectric is hafnium oxide, or zirconium oxide, or aluminum oxide.

Example 20 includes the subject matter of any one of Examples 16-18, wherein the high-k material comprises oxygen and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 21 includes the subject matter of any one of Examples 16-20, wherein the metal silicate comprises silicon, oxygen, and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 22 includes the subject matter of any one of Examples 16-21, wherein the at least one conductive layer comprises tungsten.

Example 23 includes the subject matter of any one of Examples 16-22, wherein the at least one selector layer comprises chalcogenide and a dopant.

Example 24 includes the subject matter of any one of Examples 16-23, wherein the phase change layer comprises chalcogenide.

Example 25 is an integrated circuit that includes the memory device of any one of claims 16-24.

Example 26 is a printed circuit board that includes the memory device of any one of claims 16-24.

Example 27 is an electronic device that includes a chip package comprising one or more dies. At least one of the one or more dies includes a first stack of layers comprising at least one conductive layer and at least one selector layer, a phase change layer over the first stack of layers, one or more conductive layers over the phase change layer, a first dielectric layer on one or more sidewalls of at least the phase change layer, and a second dielectric layer on the first dielectric layer and over the one or more sidewalls of at least the phase change layer. The second dielectric layer comprises a high-k material or a metal silicate.

Example 28 includes the subject matter of Example 27, wherein the first dielectric layer comprises a nitride and the high-k material comprises hafnium oxide, zirconium oxide, or aluminum oxide. In some such examples, the high-k dielectric is hafnium oxide, or zirconium oxide, or aluminum oxide.

Example 29 includes the subject matter of Example 27, wherein the high-k material comprises oxygen and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 30 includes the subject matter of any one of Examples 27-29, wherein the metal silicate comprises silicon, oxygen, and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 31 includes the subject matter of any one of Examples 27-30, wherein the at least one conductive layer comprises tungsten.

Example 32 includes the subject matter of any one of Examples 27-31, wherein the at least one selector layer comprises chalcogenide and a dopant.

Example 33 includes the subject matter of any one of Examples 27-32, wherein the phase change layer comprises chalcogenide.

Example 34 is a method of fabricating a memory device. The method includes depositing a first stack of layers over a substrate, the first stack of layers comprising at least one conductive layer and at least one selector layer; depositing a phase change layer over the first stack of layers; depositing one or more conductive layers over the phase change layer; etching through a thickness of the one or more conductive layers and the phase change layer; depositing a first dielectric layer over the first stack of layers and over one or more sidewalls of at least the phase change layer; depositing a second dielectric layer over the first dielectric layer; depositing a third dielectric layer over the second dielectric layer; and etching through a planar thickness of the first, second, and third dielectric layers, and through at least a portion of the first stack of layers.

Example 35 includes the subject matter of Example 34, wherein the first dielectric layer comprises silicon nitride, the second dielectric layer comprises a high-k material, and the third dielectric layer comprises silicon oxide.

Example 36 includes the subject matter of Example 35, wherein the high-k material comprises hafnium oxide, zirconium oxide, or aluminum oxide. In some such examples, the high-k dielectric is hafnium oxide, or zirconium oxide, or aluminum oxide.

Example 37 includes the subject matter of Example 35, wherein the high-k material comprises oxygen and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 38 includes the subject matter of any one of Examples 34-37, wherein depositing the second dielectric layer comprises depositing the second dielectric layer using thermal atomic layer deposition (ALD).

Example 39 includes the subject matter of Example 38, wherein depositing the second dielectric layer comprises depositing the second dielectric layer to a thickness between 5 Å and 25 Å.

Example 40 includes the subject matter of any one of Examples 34-39, wherein depositing the first dielectric layer comprises depositing the first dielectric layer using plasma-enhanced chemical vapor deposition (PECVD).

Example 41 includes the subject matter of Example 40, wherein depositing the first dielectric layer comprises depositing the first dielectric layer to a thickness between 10 Å and 50 Å.

Example 42 includes the subject matter of any one of Examples 34-41, wherein depositing the third dielectric layer comprises depositing the third dielectric layer using plasma-enhanced ALD (PEALD).

Example 43 includes the subject matter of Example 42, wherein depositing the third dielectric layer comprises depositing the third dielectric layer to a thickness between 10 Å and 30 Å.

Example 44 includes the subject matter of any one of Examples 34-43, wherein depositing the third dielectric layer comprises depositing a silicate comprising at least silicon and oxygen.

Example 45 includes the subject matter of Example 44, wherein the silicate further comprises one or more of Li, B, Mg, Al, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 46 includes the subject matter of any one of Examples 34-45, wherein depositing the second dielectric layer comprises depositing a silicate comprising at least silicon and oxygen.

Example 47 includes the subject matter of Example 46, wherein the silicate further comprises one or more of Li, B, Mg, Al, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

Example 48 includes the subject matter of any one of Examples 34-47, wherein depositing the first stack of layers comprises depositing at least one layer comprising tungsten.

Example 49 includes the subject matter of any one of Examples 34-48, wherein depositing the first stack of layers comprises depositing at least one layer comprising carbon.

Example 50 includes the subject matter of any one of Examples 34-49, wherein the at least one selector layer comprises chalcogenide and a dopant.

Example 51 includes the subject matter of any one of Examples 34-50, wherein the phase change layer comprises chalcogenide.

What is claimed is:

1. A memory device comprising:
   a first memory cell in an array and including a first layer of phase change material, the first layer including a first sidewall;
   a second memory cell in the array and laterally adjacent but spaced from the first memory cell, the second memory cell including a second layer of the phase change material, the second layer including a second sidewall that faces the first sidewall;
   a first dielectric structure including first and second dielectric layers, the first dielectric layer on the first sidewall, and the second dielectric layer on the first dielectric layer and comprising a high-k dielectric or a metal silicate; and
   a second dielectric structure on the second sidewall, wherein the first memory cell further includes a first selector layer, and the first dielectric structure is not on the first selector layer, and wherein the second memory cell further includes a second selector layer, and the second dielectric structure is not on the second selector layer.

2. The memory device of claim 1, wherein:
   the first memory cell further includes a first conductive structure between the first selector layer and the first layer of the phase change material; and
   the second memory cell further includes a second conductive structure between the second selector layer and the second layer of the phase change material.

3. The memory device of claim 2, wherein:
   the first dielectric structure is on at least one surface of the first conductive structure; and
   the second dielectric structure is on at least one surface of the second conductive structure.

4. The memory device of claim 1, wherein:
   the first memory cell further includes a first upper contact structure and a first lower contact structure, the first layer of the phase change material and the first selector layer being between the first upper contact structure and the first lower contact structure; and
   the second memory cell further includes a second upper contact structure and a second lower contact structure, the second layer of the phase change material and the second selector layer being between the second upper contact structure and the second lower contact structure.

5. The memory device of claim 1, wherein the first dielectric layer comprises a nitride and the high-k dielectric comprises oxygen and one of hafnium, zirconium, or aluminum.

6. The memory device of claim 1, wherein the high-k dielectric comprises oxygen and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

7. The memory device of claim 1, wherein the metal silicate comprises silicon, oxygen, and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

8. The memory device of claim 1, wherein the phase change material comprises chalcogenide.

9. An integrated circuit comprising the memory device of claim 1.

10. A memory device, comprising:
an array of memory cells, each memory cell comprising
a first stack of layers including at least one conductive layer and at least one selector layer;
a phase change layer over the first stack of layers;
one or more conductive layers over the phase change layer;
a first dielectric layer on one or more sidewalls of at least the phase change layer; and
a second dielectric layer on the first dielectric layer and over the one or more sidewalls of at least the phase change layer, wherein the second dielectric layer comprises a high-k material or a metal silicate, and wherein the first dielectric layer and the second dielectric layer are not on the at least one selector layer included in the first stack of layers.

11. The memory device of claim 10, wherein the high-k material comprises oxygen and one of hafnium, zirconium, or aluminum.

12. The memory device of claim 10, wherein the high-k material comprises oxygen and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

13. The memory device of claim 10, wherein the metal silicate comprises silicon, oxygen, and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

14. The memory device of claim 10, wherein the phase change layer comprises chalcogenide.

15. An integrated circuit comprising the memory device of claim 10.

16. An electronic device, comprising:
a chip package comprising one or more dies, at least one of the one or more dies comprising
a first stack of layers including at least one conductive layer and at least one selector layer;
a phase change layer over the first stack of layers;
one or more conductive layers over the phase change layer;
a first dielectric layer on one or more sidewalls of at least the phase change layer; and
a second dielectric layer on the first dielectric layer and over the one or more sidewalls of at least the phase change layer, wherein the second dielectric layer comprises a high-k material or a metal silicate, and wherein the first dielectric layer and the second dielectric layer are not on the at least one selector layer included in the first stack of layers.

17. The electronic device of claim 16, wherein the first dielectric layer comprises a nitride and the high-k material comprises hafnium oxide, zirconium oxide, or aluminum oxide.

18. The electronic device of claim 16, wherein the high-k material comprises oxygen and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

19. The electronic device of claim 16, wherein the metal silicate comprises silicon, oxygen, and one or more of Li, B, Mg, Al, Si, Ca, Sc, Ti, V, Cr, Mn, Fe, Co, Ni, Cu, Zn, Ga, Ge, Sr, Y, Zr, Nb, Mo, Ru, Rh, In, Sn, Sb, Ba, La, Ce, Pr, Nd, Sm, Eu, Gd, Dy, Ho, Er, Tm, Yb, Lu, Hf, Ta, Ir, Pt, Pb, and Bi.

* * * * *